United States Patent [19]

Hall et al.

[11] Patent Number: 5,343,548
[45] Date of Patent: Aug. 30, 1994

[54] METHOD AND APPARATUS FOR BATCH, ACTIVE ALIGNMENT OF LASER ARRAYS TO FIBER ARRAYS

[75] Inventors: Shawn A. Hall, Pleasantville; Ramon Lane, Crompond; Han-chung Wang, Chappaqua, all of N.Y.

[73] Assignee: International Business Machines Corporation, Armonk, N.Y.

[21] Appl. No.: 990,865

[22] Filed: Dec. 15, 1992

[51] Int. Cl.⁵ .................................................. G02B 6/36
[52] U.S. Cl. ........................................ 385/89; 385/91
[58] Field of Search ................................ 385/88–94; 372/50

[56] References Cited

U.S. PATENT DOCUMENTS

| | | | |
|---|---|---|---|
| 4,030,811 | 6/1977 | Khoe et al. | 385/91 |
| 4,466,696 | 8/1984 | Carney | 350/96.2 |
| 4,500,165 | 2/1985 | Scholl et al. | 350/96.2 |
| 4,730,198 | 3/1988 | Brown et al. | 385/91 |
| 4,787,696 | 11/1988 | Norris et al. | 385/89 |
| 4,802,727 | 2/1989 | Stanley | 350/96.2 |
| 4,929,045 | 5/1990 | Fuller | 350/96.15 |
| 5,026,138 | 6/1991 | Boudreau et al. | 350/96.2 |
| 5,029,965 | 7/1991 | Tan | 385/90 |
| 5,050,953 | 9/1991 | Anderson et al. | 385/89 |
| 5,093,879 | 3/1992 | Bergman et al. | 385/93 |
| 5,109,447 | 4/1992 | Chan | 372/50 |
| 5,121,457 | 6/1992 | Foley et al. | 385/89 |
| 5,182,782 | 1/1993 | Tabasky et al. | 385/89 |

FOREIGN PATENT DOCUMENTS 03116108 5/1991 Japan .

OTHER PUBLICATIONS

Flint, Jackson and Moll, "Multi-Waveguide/Laser Coupling", IBM TDB vol. 31 No. 10, Mar. 1989.
Balliet, Bauman and Gupta, "Method of Aligning Optical Fibers with LSI Chips Containing Optical Light-Emiting Sources and/or Receivers" IBM TDB vol. 25 No., 4 Sep. 1982.

*Primary Examiner*—Rodney B. Bovernick
*Assistant Examiner*—John Ngo
*Attorney, Agent, or Firm*—David Aker

[57] ABSTRACT

An apparatus for aligning a substantially co-linear array of optical devices with a substantially co-linear array of optical fibers comprising; a carrier having a slot for receiving the array of devices and the array of optical fibers; a first support plate having a first holder for holding the array of devices in place with respect to the first support plate, and electrical connections for electrically connecting to selected ones of the devices in the array of devices; a second support plate having a second holder for holding the array of fibers in rough alignment with the array of devices; and a positioner for positioning the carrier with respect to the first holder and the second holder so that when the holders are activated, the array of devices and the array of fibers are held in approximate alignment without the presence of the carrier.

15 Claims, 14 Drawing Sheets

Coupling Efficiencies Before Gluing:
Batch Aligned vs. Individually Aligned;
Fiber Bevel = 6 Degrees Coupling Efficiencies:
Before Gluing versus After Gluing

METHOD AND APPARATUS FOR BATCH, ACTIVE ALIGNMENT OF LASER ARRAYS TO FIBER ARRAYS

TECHNICAL FIELD OF THE INVENTION

This invention relates to first-level packaging of transmitting optical interconnects. More particularly, it relates to a method and apparatus for actively aligning a one-dimensional array of edge-emitting diode lasers to a corresponding array of single-mold fibers.

BACKGROUND ART

In optical communications, it is difficult and often costly to make the connection between laser diodes and fibers, particularly single-mode fibers. In order to achieve efficient optical coupling, the laser must be aligned to the fiber to tight tolerances; typically $\pm 1$ to $2 \mu m$ for single-mode fibers and $\pm 10 \mu m$ for multimode fibers.

Methods of laser-to-fiber alignment may be divided according to two criteria:
1. Piece-by-piece vs. batch. In piece-by-piece methods, an individual laser die, usually pre-packaged in a TO can, is aligned to a single fiber, or to the center of a bore which later accepts a fiber centered in a precision ferrule. By contrast, in batch methods, an array of lasers is aligned to an array of fibers. This succeeds to the extent that each array is straight and the center-to-center spacings match.
2. Active vs. passive. In active alignment methods, the laser is energized to produce light; whatever portion of this light successfully emerges from the back end of the fiber is monitored by a photodetector. Thus, the best-aligned position is determined explicitly by moving the energized laser with respect to the fiber to maximize the photodetected signal. By contrast, in passive alignment methods, the best-aligned position is determined implicitly by microscopic visual alignment of certain geometric features assumed to have known relationships to the optical centerlines.

Most prior-art alignment schemes are piece-by-piece and active. These schemes are inherently expensive because each part is handled individually, each fiber is individually polished, and each alignment is separately performed. Moreover, arrays of interconnects which are needed to achieve high-speed data rates via multiple fibers are bulky and inconvenient if built from piece-made packages.

Several prior-art alignment schemes are batch and passive. Batch alignment is advantageous because it shares the cost of handling, polishing, and alignment among the many elements of an array. However, the advantages of passive alignment are questionable: the schemes require costly precision jigging for "dead reckoning," and impose tight tolerances on the location of fiducials or other geometric features which must be precisely located with respect to the optical centerlines. Moreover, the method may require custom laser arrays having special fiducials, and imposes stringent tolerances on the V-grooves which hold the fibers. Both of these requirements are costly.

SUMMARY OF THE INVENTION

It is a principal object of the invention to provide a method and apparatus which combines the cost advantages of batch alignment with the cost advantages, simplicity and dependability of active alignment.

The present invention is directed to a method for aligning a substantially co-linear array of lasers with a substantially co-linear array of optical fibers, comprising the steps of activating a laser in proximity to a first end of said laser array; positioning the laser array with respect to the fiber array to maximize energy coupled from the activated laser to its corresponding fiber; activating a laser in proximity to a second end of said laser array; and positioning the laser array with respect to the fiber array to maximize energy coupled from the activated laser to its corresponding fiber. The method may further comprise activating at least one additional laser in said laser array; positioning the laser array with respect to the fiber array to maximize energy coupled from the additional laser to its corresponding fiber; and using regression analysis to determine the optimum position of the laser array with respect to the fiber array to optimize the coupling in accordance with a predetermined criteria.

One possible criteria may be a least squares fit. Alternatively, the criteria includes positioning the laser array with respect to the fiber array so that the energy which represents the minimum amount of energy coupled between a laser and its respective fiber is maximized.

The method further comprises the step of positioning at least one photodetector to detect light coupled into the fiber. The photodetector is used to determine the maximum energy coupled from an activated laser to a corresponding fiber.

The present invention also contemplates an article of manufacture comprising a substantially co-linear array of lasers; a substantially co-linear array of optical fibers substantially in alignment with said array of lasers; a substrate for supporting said array of optical fibers and said array of lasers; and a plurality of relatively large electrical contact pads, each pad being electrically coupled to one of said lasers, said pads being for receiving electrical contacts for activating selected ones of said lasers.

The present invention is also directed to an apparatus for aligning a substantially co-linear array of lasers with a substantially co-linear array of optical fibers comprising; a carrier having a slot for receiving the array of lasers and the array of optical fibers; a first support plate having a first holding means for holding said laser array in place with respect to said first support plate, and means for electrically coupling to selected ones of said lasers; a second support plate having a second holding means for holding the fiber array in rough alignment with the laser array; and means for positioning said carrier with respect to said first holding means and said second holding means so that when said holding means are activated, said laser array and said fiber array are held in approximate alignment without said carrier.

The holding means may each comprise means for supplying a vacuum, and an opening in a respective support plate through which vacuum is applied to a respective array.

The apparatus may further comprise adjustment means for moving said first support plate with respect to said second support plate; and an optical microscope for observing alignment of said laser array with respect to said fiber array.

The apparatus may additionally comprise positioning means for positioning a substrate to which said laser array and said fiber optic array are to be bonded, in close proximity thereto. The positioning means may include a window positioned so that electromagnetic energy may be transmitted through said substrate.

The window and substrate are preferably transparent to ultraviolet light so that ultraviolet curing adhesive applied to said substrate to bond said substrate to said laser array and said optical fiber array may be cured by said ultraviolet light.

DETAILED DESCRIPTION OF THE PREFERRED EMBODIMENTS

Figure 1:
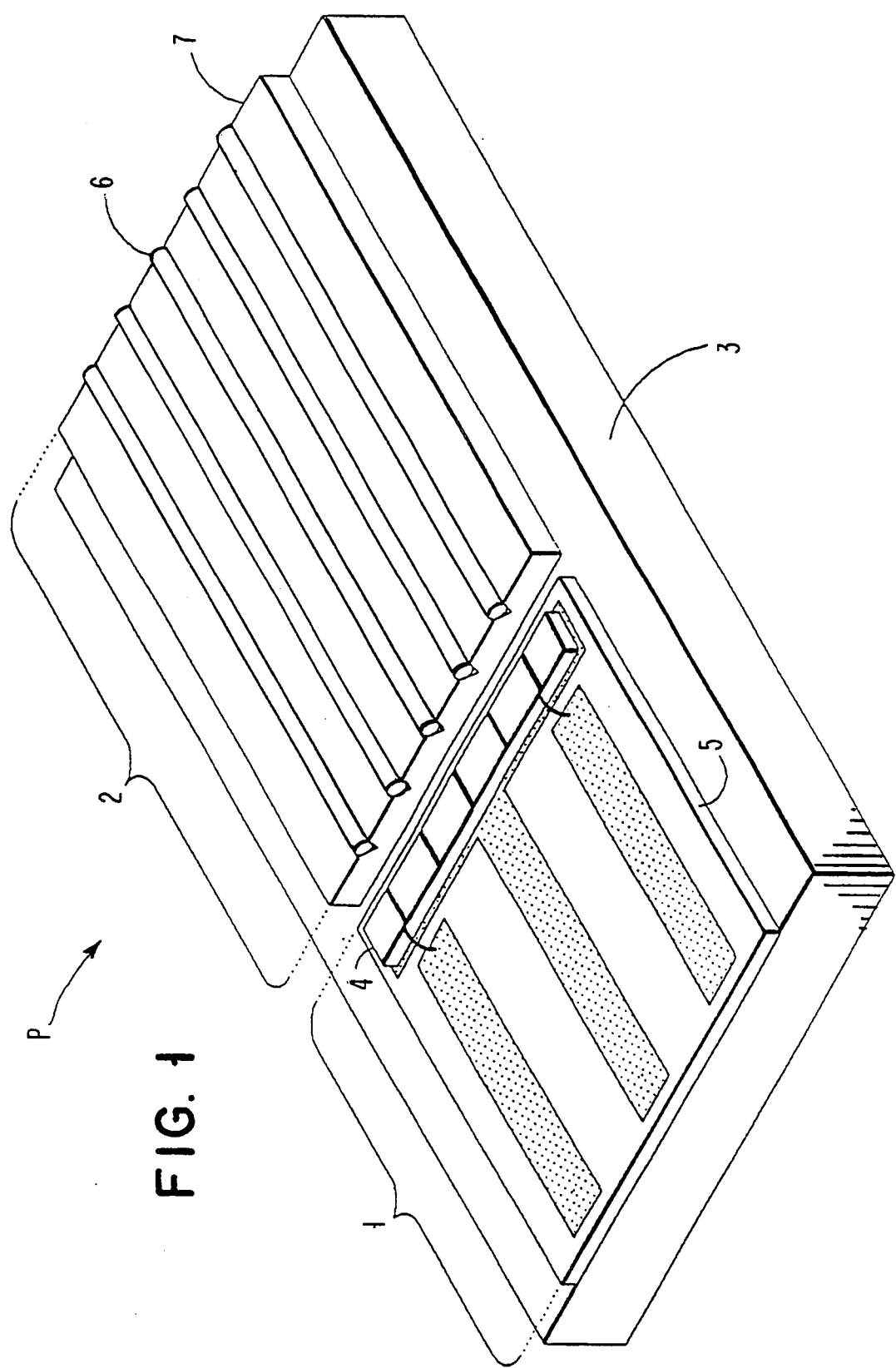
FIG. 1 is an enlarged perspective view of a package produced in accordance with the invention.

FIG. 1 depicts a final package P produced by the method and apparatus of the invention. Package P includes a laser assembly 1 a fiber assembly 2, and a substrate 3 to which both assemblies are bonded after alignment. Laser assembly 1 consists of a laser bar 4 which is soldered and wire-bonded to a metallized silicon carrier 5. The fiber assembly consists of an array of stripped, single-mode fibers 6 which are epoxied to a V-grooved silicon carrier 7 and polished on both ends. The present invention includes a method of aligning the two assemblies and attaching them permanently to the substrate 3.

Figure 2:
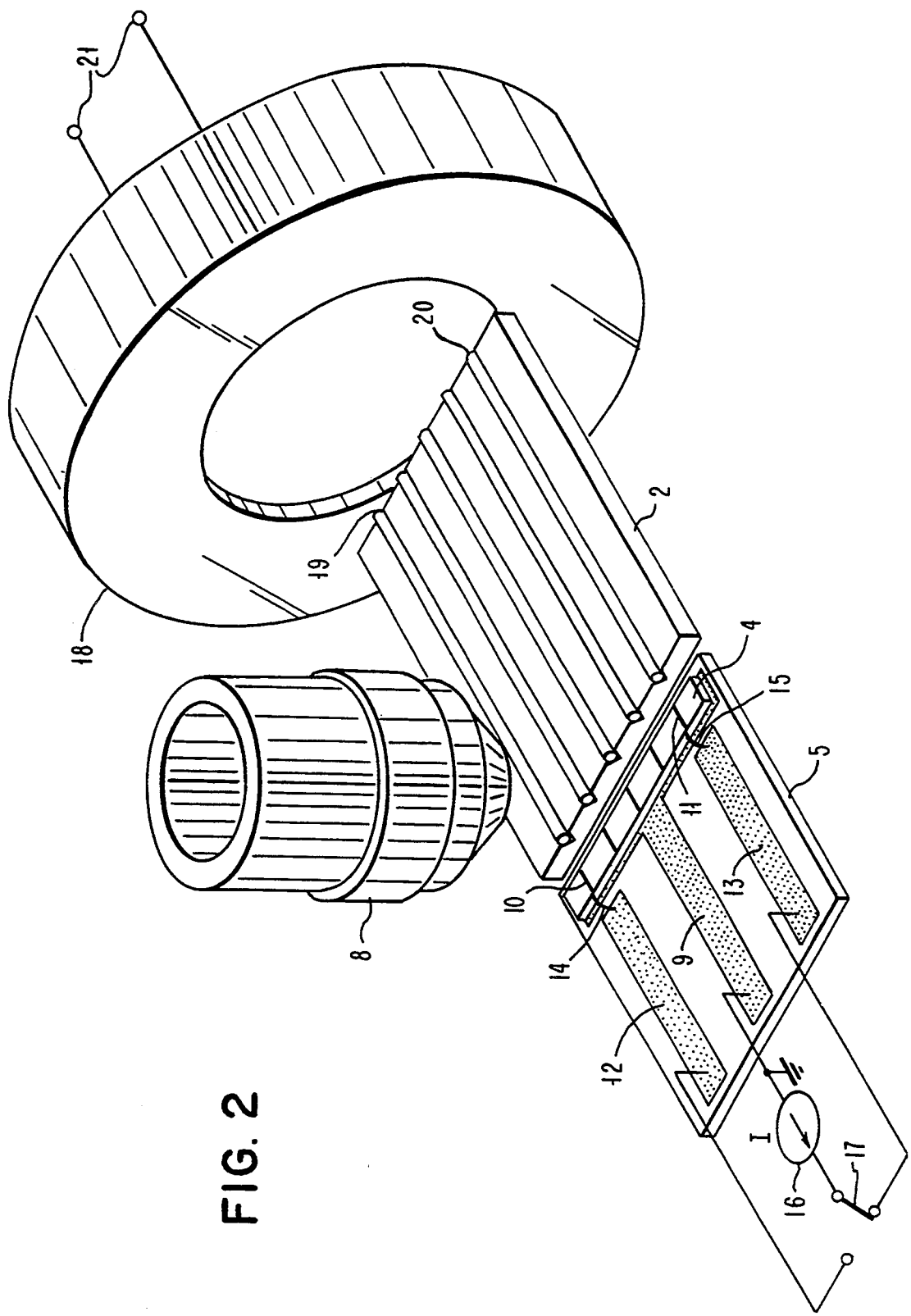
FIG. 2 is an enlarge perspective conceptual view used to illustrate the alignment method of the invention.

FIG. 2 illustrates, conceptually, the alignment scheme. First, the two arrays are aligned coarsely by visual means under microscope objective 8. Then, active alignment is used for the critical fine tuning. In preparation for active alignment, the laser bar 4 has been soldered to the silicon carrie 5 via the center gold pad 9 (a common ground pad), and two lasers 10 and 11, one near each end of the array, have been wire bonded to the side pads 12 and 13 via wire bonds 14 and 15. During active alignment, the three pads are connected to a current source 16 via switch 17, so that the two selected lasers 10 and 11 may be energized alternately. The fiber sub-assembly 2 is positioned in front of a wide-area photodetector 18, so that the light transmitted through either of the two fibers, 19 or 20, impinges on the photodetector, thereby producing a signal at output leads 21. The size of the photodetector is large enough to capture the light from both fibers 19 and 20 without mechanical repositioning. Thus to monitor alternately the alignment of the two laser/fiber pairs 10, 19 or 11, 20, it is necessary merely to toggle the switch 17. With this arrangement, active alignment is achieved simply by micropositioning the laser assembly with respect to the fiber assembly to maximize the photodetected signals.

Figure 3:
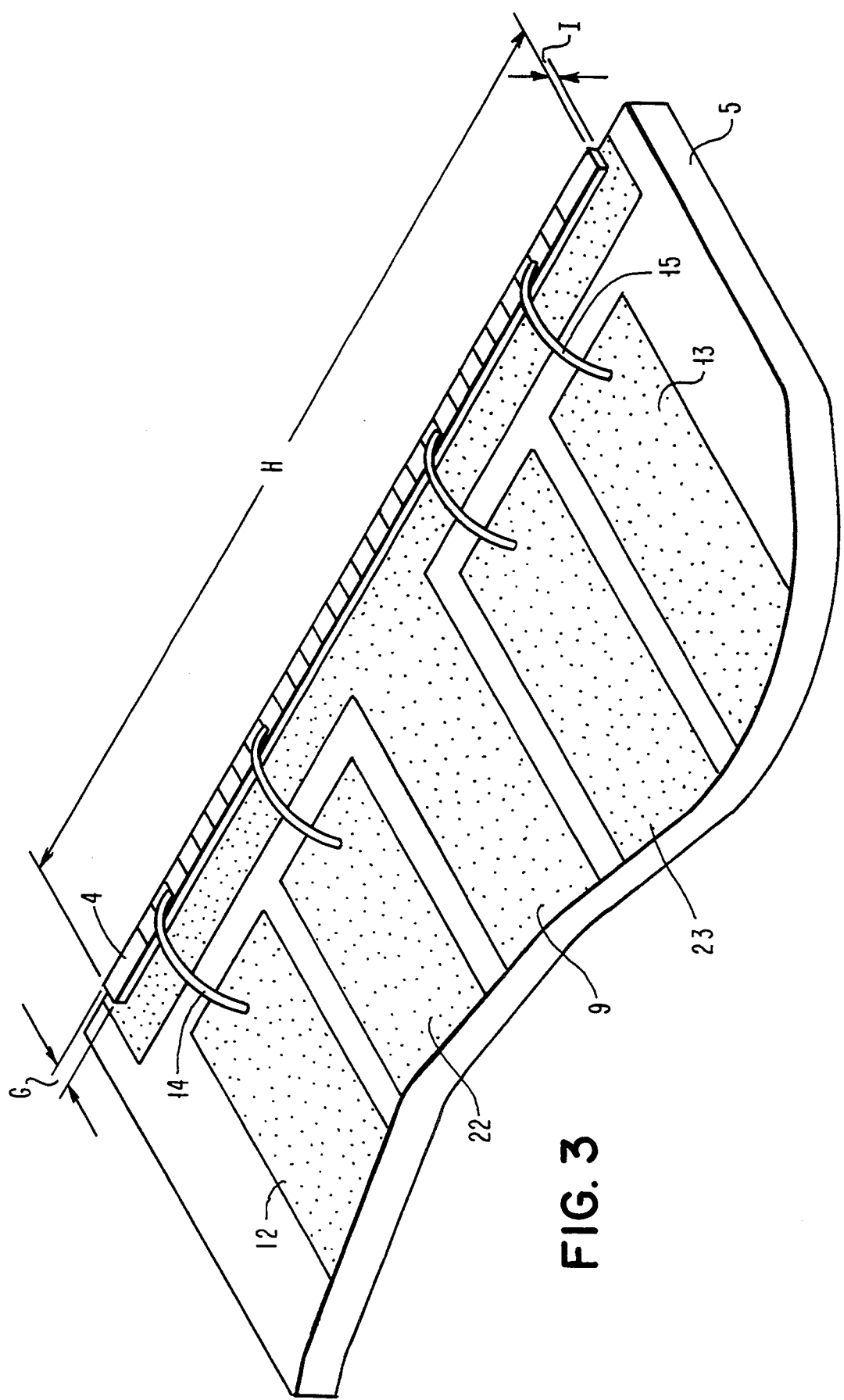
FIG. 3 is an enlarged scale fragmentary perspective view of a portion of the apparatus of FIG. 1.

FIG. 3 illustrates details of the laser bar 4. It is a thirty-two-laser array of 1.3-$\mu$m wavelength lasers spaced on 375-$\mu$m centers. The laser bar 4 and its silicon carrier 5 are drawn to scale in this figure. Dimensions G, H and I are 0.3 mm, 13.5 mm and 0.12 mm, respectively. In all other figures, only five of the thirty-two lasers are shown for the sake of clarity, and the size of the laser bar is greatly exaggerated with respect to other objects.

Laser bar 4 has a common, back-side ground (not shown) which is a gold pad covering the entire bottom surface of the laser bar. As discussed previously (FIG. 2), this gold pad is soldered to the center pad 9 of the silicon carrier, while the "hot" side of several selected lasers are wire bonded to the side pads 12 and 13. Although conceptually only two bonded-out lasers are necessary (as suggested in FIG. 1 and FIG. 2), it is useful in practice to bond out two additional lasers, at intervals along the array, as shown in FIG. 3. Thus there are five gold pads 9, 12, 13, 22, 23, and the current source 16 in FIG. 2 is connected to a four-pole (rather than a two-pole) switch. This permits the alignment to be assessed at several intermediate points along the array, rather than just at the ends, which is useful in checking on collinearity of the arrays. The gold connection pads are relatively large. By large it is meant that the pads have dimensions larger than that of the lasers and a size which facilitates electrical connection thereto during the alignment procedure.

The configuration in FIG. 3 is merely illustrative. More generally, the arrangement of gold pads and wire bonds is dependent on the laser bar's design and on package requirements. For example, for most realistic configurations, laser-driver circuitry would be mounted on the silicon close to the lasers themselves. Furthermore, for high-speed array interconnects, it may be preferable for each laser to have a separate ground return. Such variations are entirely compatible with the invention, and do not alter its essence.

Figure 4:
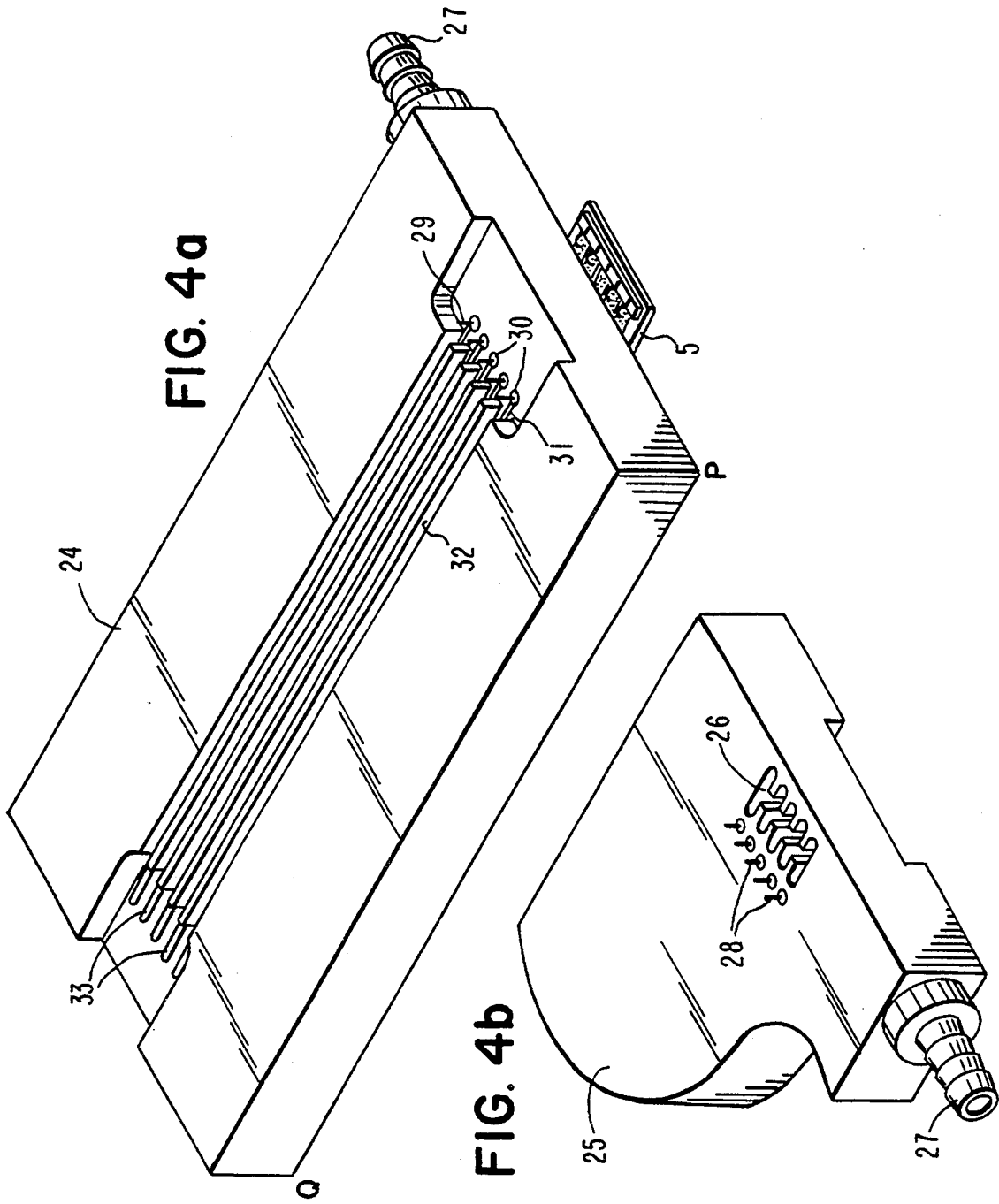
FIG. 4(a) is an enlarged perspective view of an apparatus for holding the laser assembly in accordance with the invention.
FIG. 4(b) is an enlarged perspective cut away view of the bottom of the apparatus of FIG. 4(a).

FIG. 4(a) and 4(b) illustrate an apparatus for holding the laser assembly. To permit attachment of the common substrate 3 shown in FIG. 1, it is necessary, during alignment, to leave the bottom surface of the laser carrier 5 unobstructed. Thus it is necessary to hold the laser assembly, and to make electrical connections to the five gold pads, from above.

Laser carrier 5 is held to the bottom surface 25 of plate 24 by means of the vacuum chuck 26, which is fed via a vacuum fitting 27 such as a Clippard Minimatic Fitting. The surface 25 is ground and polished flat to prevent warping the laser assembly when vacuum is applied. This is necessary to avoid spoiling the collinearlity of the lasers along the bar, which is an essential requirement for batch alignment. After polishing, the surface is made electrically insulating (by application of 100 Å of Ti followed by 3000 Å of $SiO_2$) to prevent shorting the several contacts to each other. The force of the vacuum chuck is sufficient to compress springs (not shown) urging spring-loaded pins 28, commonly known as "pogo pins" (made by Interconnect Devices as model TRI-0-C-1-1N) so that the five gold pads on the laser carrier 5, pulled flush to the surface 25, make good electrical connection to the five compressed pins.

The pins 28 extend through the thickness of plate 24. Their non-spring-loaded ends 29 protrude through the top surface. Each pin is surrounded by an insulating collar 30, made of Vespel polyimide, which is push fit into a hole in the steel plate. As shown in FIG. 4(a), the tops of the pins 29 make contact to pieces of insulated wire 31 with the insulation being stripped back near the pins as shown. The stripped wires are butted to the pins and soldered. The insulated portion of the wires 31 lay snugly in slots 32 in the steel plate, and emerge near the rear of the plate at 33. Here the insulation is also stripped back, so that the five wires form the male end of a standard, 0.1"-pitch connector. Thus the electrical connections suggested conceptually in FIG. 2 are realized in a context which leaves the bottom surface of the laser assembly unobstructed and capable of accepting the common substrate 3 after alignment.

Figure 5:
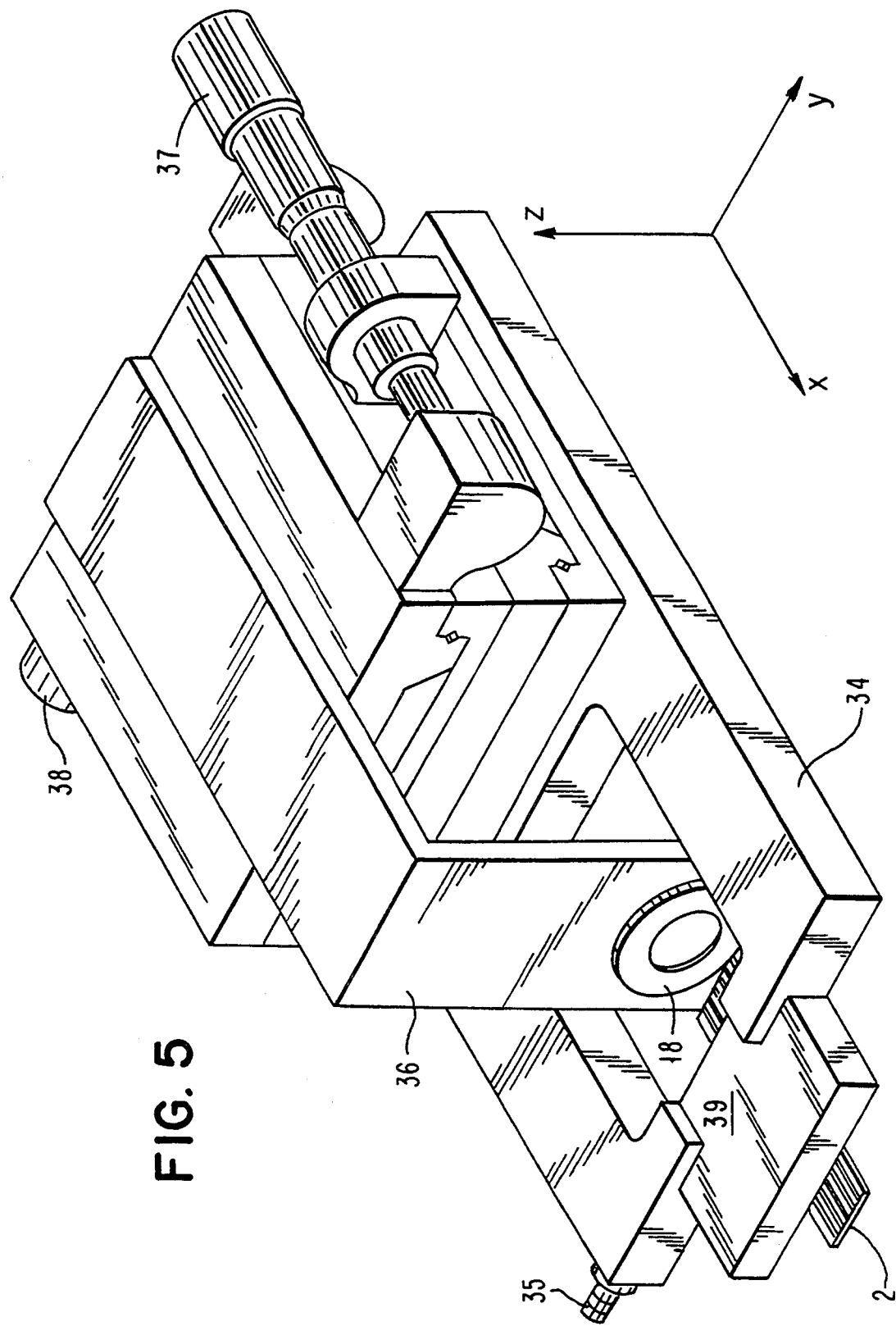
FIG. 5 is an enlarged perspective view of an apparatus for holding a fiber assembly.

FIG. 5 illustrates an apparatus for holding the fiber assembly, from above, for the reason already discussed. In addition, to permit active alignment, the fibers must be monitored by the large-area photodetector 18 (FIG. 2). In FIG. 5, the fiber assembly 2 is held to plate 34 by vacuum, which is supplied through vacuum fitting 35. The vacuum seal is imperfect because the centers of the fibers lie in the plane of the fiber carrier's top surface, so the gap between the fiber carrier and the vacuum chuck is one fiber radius (62.5μ). Nevertheless, the vacuum is strong enough to hold the fiber assembly securely. The large-area photodector 18 is affixed to L-bracket 36, which locates the centerline of the photodetector at roughly the same z-coordinate as the fiber cores. Micrometer adjustment of photodetector 18 is provided in the other two directions, x and y, via stage micrometers 37 and 38, respectively. During alignment, photodetector 18 is moved close to the fibers to insure that all the light is captured; during final attachment of the substrate 3 (FIG. 1), photodetector 18 is retracted. The vacuum plate 34 is designed to provide maximum stiffness within the working distance allowed by microscope objective 8 (FIG. 2). For this reason the plate is milled down at the front. Surface 39 is only 9 mm above the fibers, which is less than the working distance of the objective. Two objectives which may be typically used are Leica 569143, 10×, with a working distance of 17 mm or Leica 569244, 25×, with a working distance of 11 mm.

Figure 6:
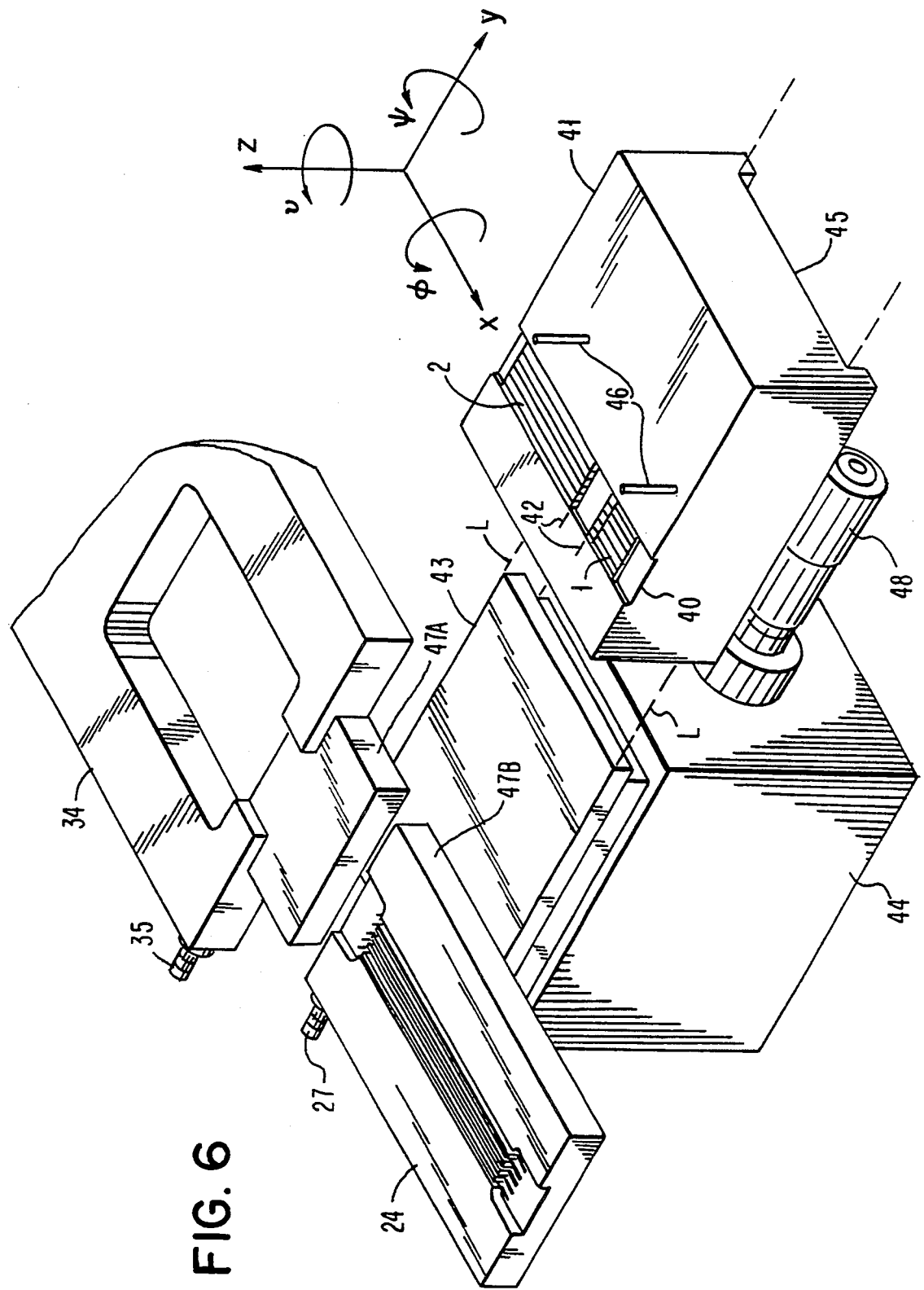
FIG. 6 is an enlarged perspective view illustrating the means for delivering the laser and fiber arrays to the alignment apparatus.

The alignment procedure begins by delivery of the two critical parts, the laser assembly 1 and fiber assembly 2, to the alignment fixture. FIG. 6 illustrates how these parts come together in the alignment fixture.

Figure 7:
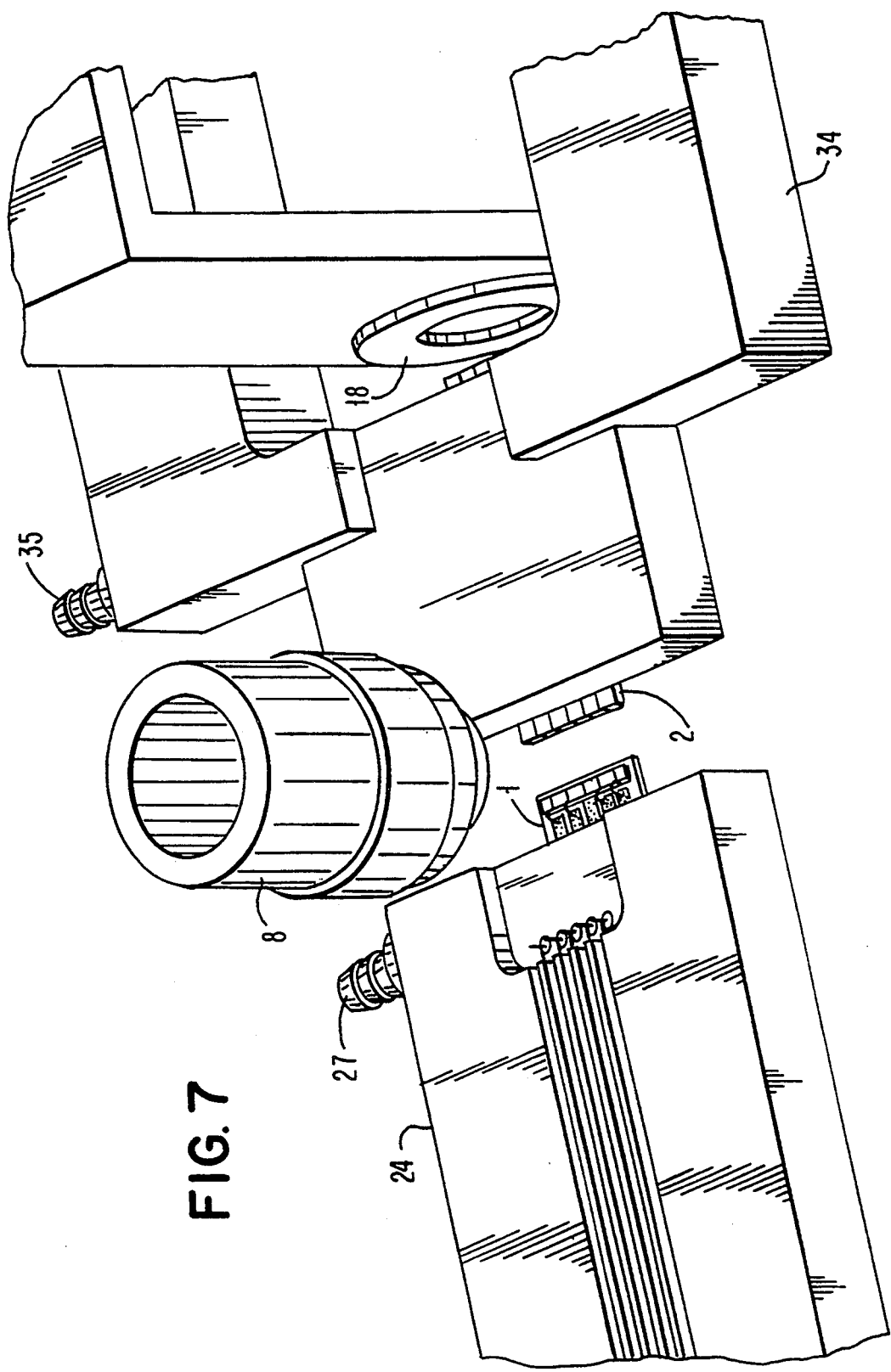
FIG. 7 illustrates the central elements of the alignment apparatus after delivery of the laser and fiber arrays.

Parts delivery is essentially a very coarse alignment procedure. The laser assembly 1 and the fiber assembly 2, are placed into the machined notch 40 of delivery table 41, and their inside edges are aligned by eye to the index marks 42 as shown. Next the delivery table 41 is slid in the negative y direction, along the path of the dashed lines L, onto platform 43 of lifter stage 44 (which may be a Newport Model 416), using notch 45 as a guide. Notch 45, which runs the length of the bottom surface of delivery table 41, is machined for a close, sliding fit over platform 43. The sliding motion is arrested by contact of locating pins 46 against the respective front planar surfaces 47A and 47B of vacuum plates 24 and 34 which have been previously aligned in any of several ways well known in the art. Finally, platform 43 is raised (+z direction), using micrometer 48, thereby compressing the pins 28 (FIG. 4) and bringing laser assembly 1 and fiber assembly 2 into contact with vacuum plates 24 and 34, respectively. At this point the vacuum chucks are turned on, via vacuum supplied hoses (not shown) connected to fittings 27 and 35, and the delivery table is lowered and removed. The result is shown in FIG. 7. The delivered parts are now firmly held to the bottom surfaces of vacuum plates 24 and 34.

The sequence of steps just described accomplishes rough alignment of the two parts as follows: Rough alignment in the x,y, and θ directions is achieved by notch 40, locating pins 46, index marks 42, and the sliding fit of notch 45 on platform 43. This insures that the delivered parts mate properly with the vacuum chucks, and that the gold contact pads on the laser assembly mate properly with the pins 28. Rough alignment in the φ, ψ and z directions is achieved by indexing of the laser and fiber assemblies to the bottom surfaces of the vacuum plates 24 and 34. These two surfaces are coplanar by virtue of tilt adjustments described below.

Figure 8:
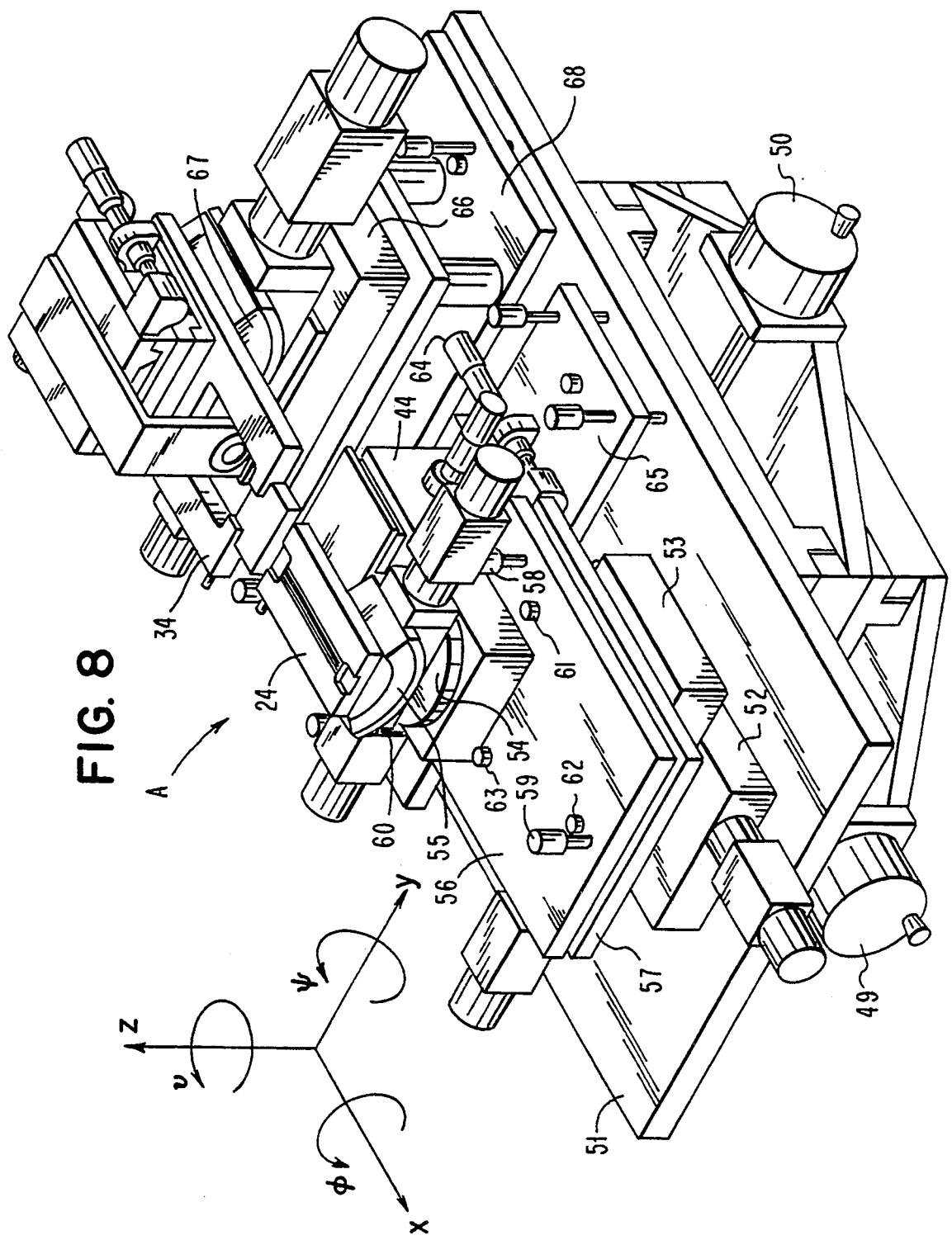
FIG. 8 is a perspective view of the entire alignment apparatus, with the microscope omitted to allow enhanced viewing.

FIG. 8 is an assembly drawing of the alignment apparatus A with the microscope objective omitted for clarity. The apparatus is placed under a high-quality microscope (not shown) with a large working area such as Leica's ELR microscope stand. The entire assembly rests on a shock-isolated table, such as Newport VW-3042. At the top of FIG. 8 are the vacuum plates 24 and 34 (described previously in FIG. 4 and FIG. 5), which hold the laser and fiber assemblies respectively. At the center of the figure is the lifter stage 44. (described previously in FIG. 6), which is used for parts delivery. The remainder of the equipment is present for the purpose of positioning the laser and fiber assemblies with respect to each other and with respect to the microscope objective 8 (shown in FIG. 7).

The positioning equipment may be regarded as four stacks of stages:

1. Master stages. Underlying the other three stage stacks are the master xy stages 49 and 50 such as Melles Griot 07TAC012, which are used to position the remainder of the assembly (everything above and including a large base plate 51) with respect to the microscope objective in the x and y directions respectively. Master adjustment in the z direction is handled by the microsocpe's focussing stage.

2. Laser stack. Located on the left of FIG. 8, the laser stack consists of micro-stepped fine positioners including linear stages 52 and 53 (Klinger UT100), a rotary stage 54 (Klinger UR100), and a goniometric cradle 55 (Klinger B650), which manipulate the laser assembly in the x, y, θ, and φ directions respectively, as well as a leveling assembly 56 and 57. The linear stages 52 and 53 have 0.1-μm resolution (micro-stepped); the angular stages 54 and 55 have 0.001° resolution. The (φ, ψ)

attitude of levelling plate 56 is controlled by three, fine-pitched, ball-bearing-tipped adjustment screws 58, 59 and 60. These screws are used for preliminary tilt adjustment of the laser-holding vacuum plate 24, in order to establish parallelism of its bottom surface to the focal plane of the microscope in the $\phi$ and $\psi$ directions. This tilt adjustment needs to be done only once when the fixture is set up: subsequently, fine adjustment of the laser assembly in the $\phi$ direction is handled by the motorized stage 55; whereas fine adjustment in the $\psi$ direction is not necessary, since laser-to-fiber alignment is not very sensitive in that direction.

3. Delivery stack. Located in the center of FIG. 8, the delivery stack consists of a lifter stage 44, described earlier in connection with FIG. 6, an auxiliary stage 64, which adjusts the position of lifter stage 44 in the x direction, and a three-point levelling plate 65 (analogous to plate 56 described above), which is used to establish parallelism of the delivery table 14 (FIG. 6) with respect to the focal plane of the microscope. Again, this tilt adjustment needs to be done only once.

4. Fiber stack. Located on the right of FIG. 8, the fiber stack consists of micro-stepped lifter stage 66 (such as a Klinger UZ100) and a goniometric cradle 67 (such as a Klinger B680) which manipulate the fiber assembly in the z and $\phi$ directions with resolutions of 0.1 $\mu$m and 0.001° respectively. A three-point levelling plate 68 (analogous to the plate 56 discussed above) is used to render the bottom surface of the fiber-holding plate 34 parallel to the focal plane of the microscope in the $\phi$ and $\psi$ directions. Again, this tilt adjustment needs to be done only once.

The one-time tilt adjustments of levelling plates 56, 65, and 68 may be accomplished quickly using a high-power microscope objective and eyeball assessment of focus. Since this tilt adjustment is done only once for each plate (it is not repeated for each laser/fiber array), the manual nature of the adjustments is not an impediment to low manufacturing cost.

All three tilt adjustments are similar. As an example, the adjustment of plate 56 is considered. The objective is to render the bottom of the vacuum plate 24 parallel to the focal plane of the microscope. To do this, a surrogate piece of silicon or other flat material is held to the bottom of plate 24 (as the laser assembly is held in FIG. 4). The surface of the surrogate material is then a surrogate for the bottom of plate 24 (the two surfaces are coplanar, yet the surrogate is visible through the microscope). Thus the surrogate may act as the target surface for the levelling operation. A particularly simple levelling procedure follows. This procedure works because the ball-bearing-tipped levelling screws (58, 59 and 60) are arranged in an isosceles triangle having a base parallel to the y axis. It works only if performed in the order given. Levelling in the y and x directions may not be reversed.

a. Using the focussing stage of the microscope (with digital readout of height), the height differential $\Delta h_y$ is measured between two points on the target surface having x values which are equal but having y values which differ by $\Delta y$.

b. Levelling screw 58 is adjusted by $$\frac{\Delta Y}{\Delta y} \Delta h_y,$$

where $\Delta Y$ is the y distance between screws 58 and 60. The target surface is now parallel to the y axis.

c. The height differential $\Delta h_x$ is measured between two points on the target surface having y values which are equal but having x values which differ by $\Delta x$.

d. Levelling screw 59 is adjusted by $$\frac{\Delta X}{\Delta x} \Delta h_x,$$

where $\Delta X$ is the x distance between screws 58 and 59. The target surface is now parallel to both the x and y axes.

After adjustment, the attitude of plate 56 is locked in place with locking screws 61, 62 and 63, which are threaded into the lower plate 57.

After the laser and fiber assemblies have been loaded into the alignment fixture (FIG. 7), a coarse/fine strategy is used to align the two arrays. Coarse alignment is purely visual (under the microscope), and is done in the following order:

1. Align $\phi$. For each of the two arrays, the master stage 50 is used to compare focus at the two ends. Then, employing a method similar to that described above for one-time tilt adjustments of leveling plates 56, 65 and 68, "fine-tuning" tilt corrections via goniometric stages 55 and 67 is computed and applied.

2. Align z. Using the fine lifter stage 66, both arrays are brought into the same focal plane.

3. Align $\theta$. Using rotary stage 54, the front edge of laser assembly 1 is aligned to be parallel to the front edge of fiber assembly 2. During this procedure, it may be necessary to use the x stage 52 to bring the arrays close enough together to make and accurate visual determination of parallelism.

4. Set separation distance s. Using the x stage 52, a value of the laser-to-fiber separation distance s (typically on the order of 35 $\mu$m) is selected.

5. Align y. Using the linear stage 53, one of the laser ridges is visually brought into line with the center of the corresponding fiber.

The sixth degree of freedom, $\psi$, does not need fine adjustment; the initial tilt adjustments suffice.

Fine alignment is done actively, using the photodetected signals from the four energized lasers, as described above with respect to FIG. 2 and FIG. 3. The procedure is quite simple and fast for several reasons:

1. The coarse-alignment described above is very satisfactory for bringing the two arrays nearly into alignment (typically close enough to get a signal from the photodetector immediately) which eliminates blind searching.

2. In principle, only two degrees of freedom (y and z) are involved. In practice, slight adjustment of $\phi$ may also be desired to reach an optimal compromise among the four energized lasers. Compromise is required on account of pointing-angle variations in the lasers, eccentricities of the fibers, imperfect collinearity of laser and fiber arrays, and imperfect center-to-center spacing. To find the best compromise, each of the four individual optima is found, a best-fit line is computed, and the stages are indexed to accommodate it.

3. Optimization in the y and z directions is virtually independent, because coupled power as a function of misalignment is a smooth, single-peaked function. Thus it is typically necessary to find the maximum in each of the two directions only once and there is no need to go repeatedly back and forth between y and z. Even in a worst case, it is not necessary to perform more than three iterations (y—z—y or z—y—z).

Figure 9:
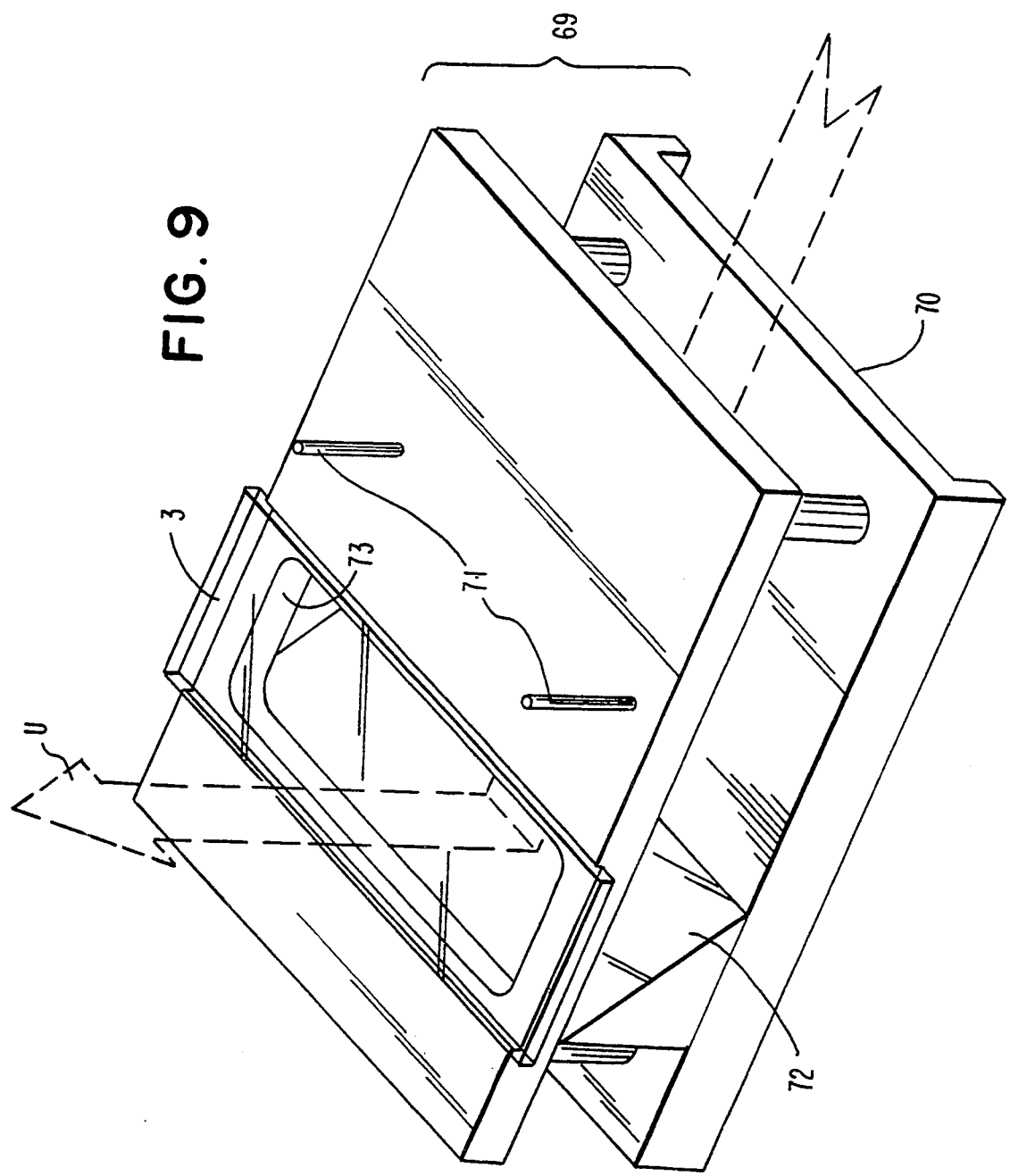
FIG. 9 is an enlarged perspective view of a fixture used to deliver the glass substrate and cure the adhesive.

After alignment has been optimized, the substrate 3 shown in FIG. 1 must be affixed to the underside of the aligned arrays, to lock then permanently in the aligned position. The method used to deliver this substrate is shown in FIG. 9. The method is similar to that described earlier (FIG. 6) for delivering the laser and fiber assemblies. The delivery table 69 in FIG. 9 is analogous to table 41 in FIG. 6. Notch 70 and locating pins 71 in FIG. 9 are analogous to notch 45 and pins 46 in FIG. 6. In FIG. 9, substrate 3 is a piece of glass such as a microscope slide. The glass has a film of optical cement such as Summers J-91 on its top surface, which may be applied using a photoresist spinner. After positioning the glass using the locating pins 71, the lifter stage 44 (FIG. 6) is used to raise the glass into contact with the already-aligned laser and fiber assemblies. As depicted by the large arrow in FIG. 9, the glue is then cured using ultraviolet light U. The light is incident at the tail of the arrow, is turned 90° by mirror 72, is transmitted through a cutout 73 and glass slide 3, and impinges on the glue. Following a cure of 1 to 2 minutes, the vacuum at fittings 27 and 35 is removed, and the finished assembly, shown in FIG. 1, is released onto table 69 and withdrawn from the alignment fixture.

Figure 10:
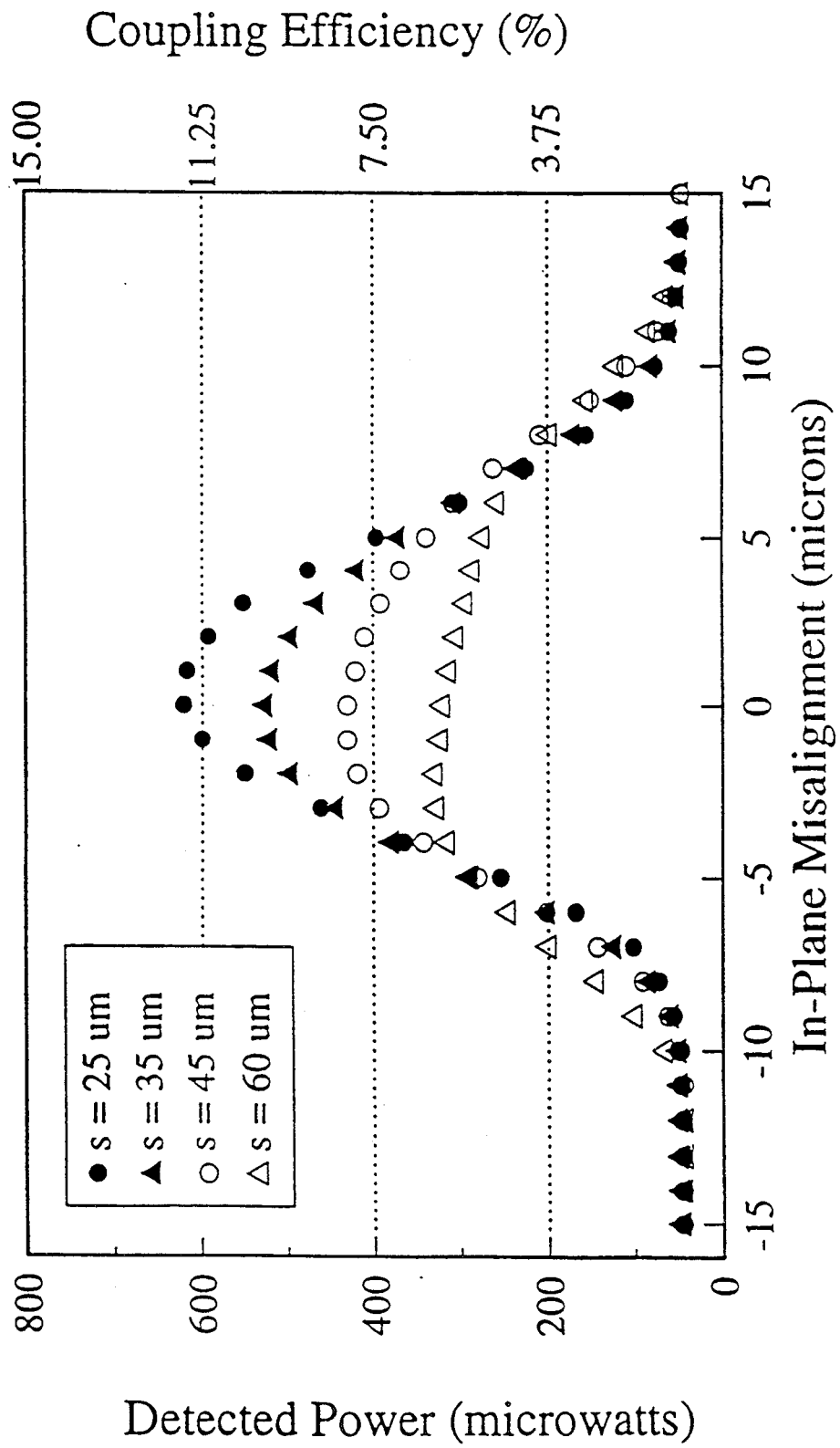
FIG. 10 is a typical graphical representation of coupling efficiency as a function of misalignment for various values of laser-to-fiber separation.

Coupling efficiency (the fraction of laser light coupled into the fiber) is the key figure of merit for laser-to-fiber alignment. For reference, a typical plot of coupling efficiency as a function of misalignment, for various values of the laser-to-fiber separation s, is shown in FIG. 10. The measurement shown agree fairly well with theoretical predictions.

Coupling efficiency is inevitably compromised by batch alignment, as mentioned above, because it is never possible to align all the laser/fiber pairs in an array as precisely as if each pair were adjusted separately. Of course the trade-off is deliberate. Some efficiency is sacrificed in exchange for the cost and packaging advantages of batch processing. A measure of just how much is discussed below.

For each laser/fiber pair, let $\eta_b$ = Batch-aligned coupling efficiency
$\eta_i$ = Optimized, individually aligned coupling efficiency.

Figure 11:
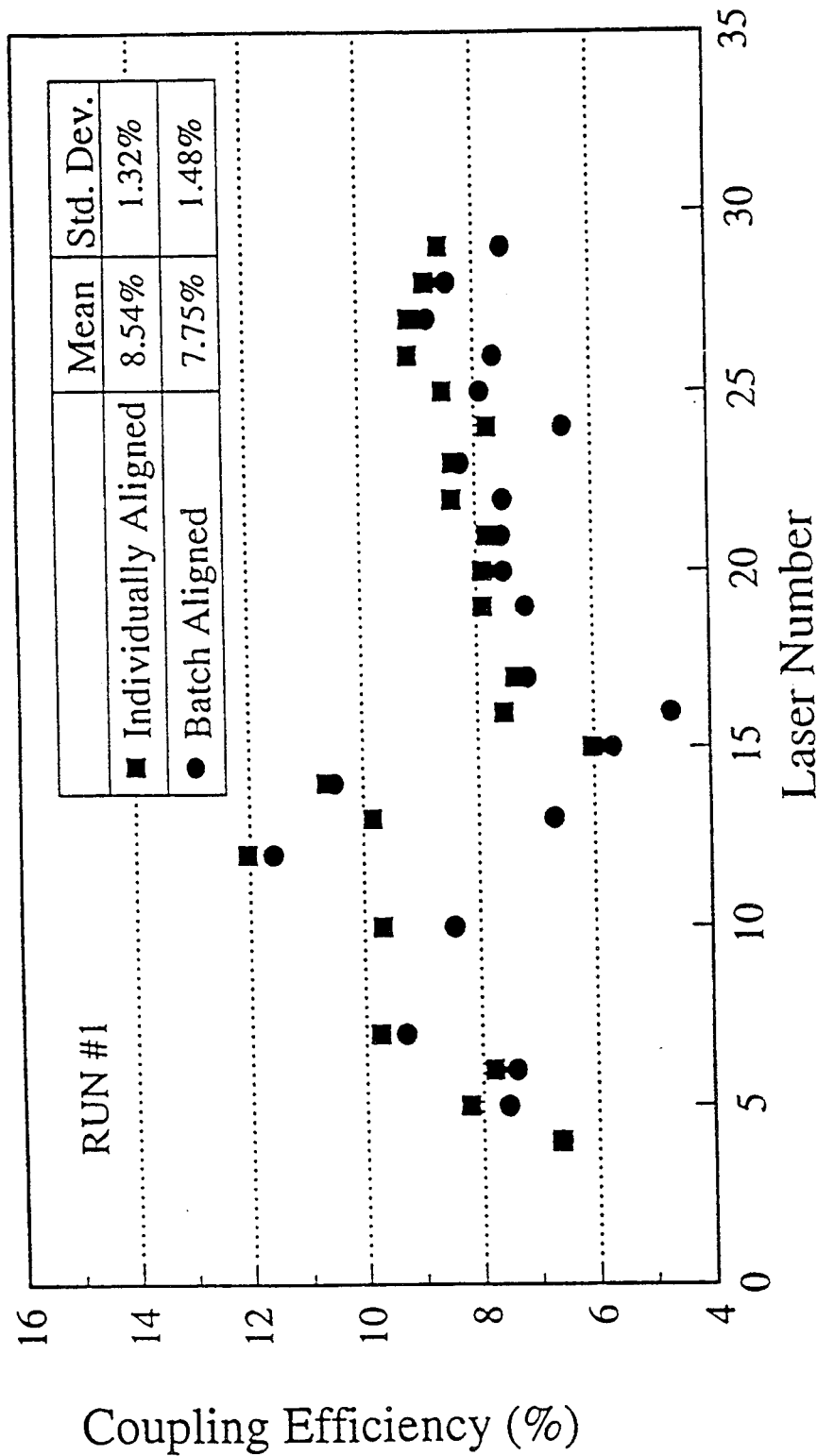
FIG. 11 is a graphical representation comparing batch-aligned coupling efficiency with optimized, individually aligned coupling efficiency across an array of thirty two laser-fiber pairs.

The values of $\eta_b$ and $\Theta_i$ may be measured, prior to attaching the substrate 3, for each laser/fiber pair in an array. Typical results across a thirty-two-wide array are shown in FIG. 11. Although there is quite a bit of variation from one laser/fiber pair to another, this variation is typically compensated in manufacturing by laser-trimmed resistors in the driving circuitry, so that the final output power is adjusted to a specified level.

To compare batch alignment and individual alignment directly, let $$R \equiv \frac{\eta_b}{\eta_i}.$$

Figure 12:
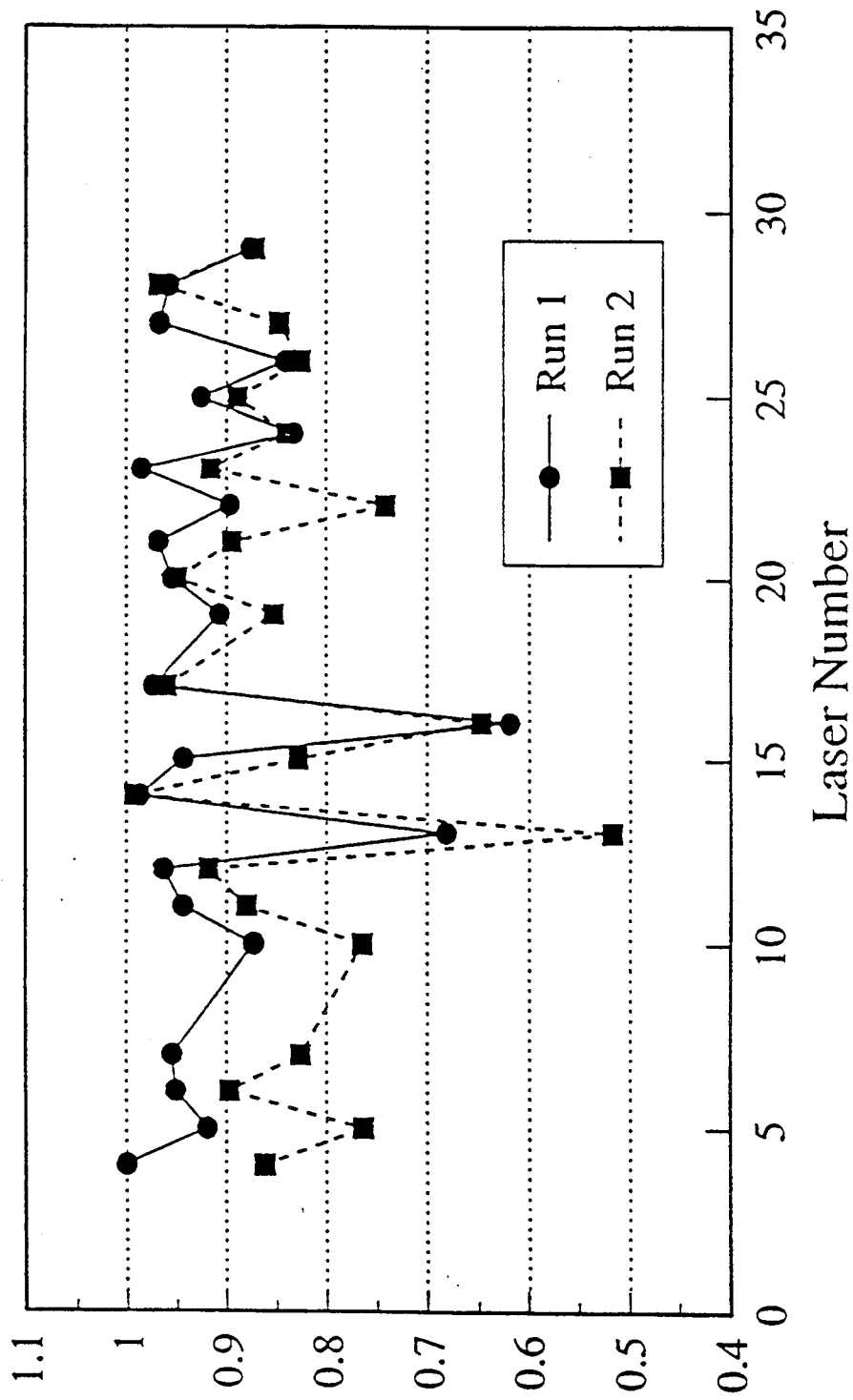
FIG. 12 is a graphical representation of the ratio of coupling efficiencies across an array of thirty two laser-fiber pairs.

Typical values of this ratio R, a figure of merit for batch alignment, are plotted in FIG. 12. The curve marked "Run 1" is the ratio of the two data sets on FIG. 11; the curve marked "Run 2" is the ratio of another, similar pair of data sets. Taken together, the two curves yield a mean of $\overline{R} = 0.878$, and a standard deviation of $\sigma_R = 0.105$. In other words, on average only 12.2 percent of the available coupling efficiency is sacrificed in exchange for the advantages of batch alignment.

Figure 13:
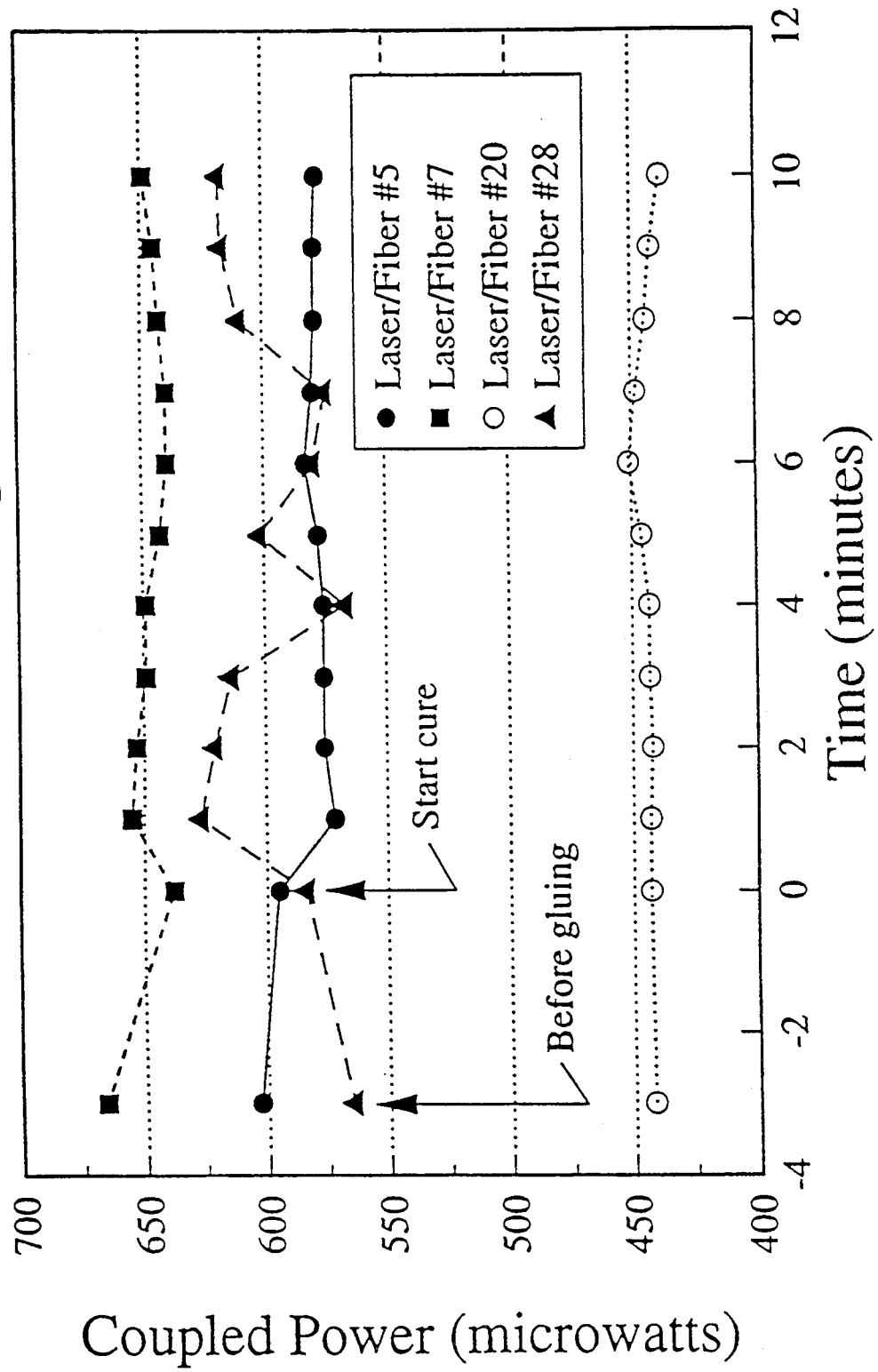
FIG. 13 is a graphic representation of power fluctuations during the gluing process.

FIG. 11 and FIG. 12 represent results obtained prior to attachment of the substrate 3. Attaching the substrate is, of course, a potential source of further misalignment. However, tests show that its effect is relatively minor. In FIG. 13, the coupled optical power corresponding to the four bonded-out lasers is monitored before and then during the gluing and curing process used to attach the substrate. The left-most set of four points on the graph represents the nominal value of batch-aligned coupled power (for the four energized lasers only) prior to disturbance by attachment of the substrate. The set of points second from the left corresponds to the time at which the substrate just comes into contact with the aligned array. The remaining points are taken at one-minute intervals during curing. The effects are mostly minor; net changes in coupling efficiency are $-4.0$, $-2.6$, $-0.9$, and $+9.4$ percent for the four lasers.

Figure 14:
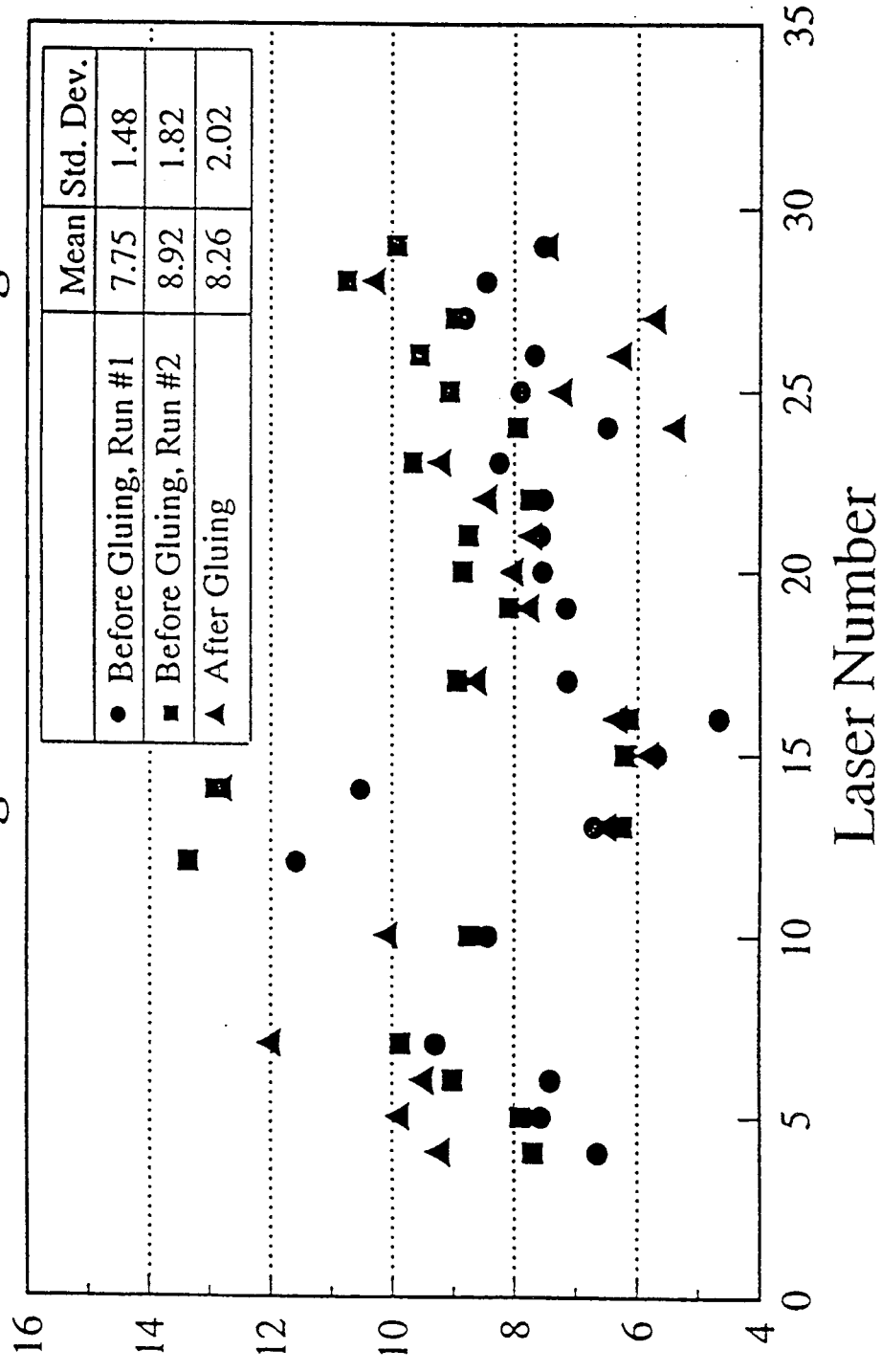
FIG. 14 is a graphical representation of a comparison of coupling efficiencies before and after gluing across an array of thirty two laser-fiber pairs.

Further information is available after curing is complete, because then all the lasers (not just the four bonded-out ones) may be energized, and the coupled power emerging from each fiber may be compared to its value prior to attaching the substrate. Such a comparison is shown in FIG. 14. The coupling efficiency for some laser/fiber pairs decreases during the gluing process, but increases for others. The increases are possible because the original batch-aligned position is not optimal for every laser/fiber pair, so that perturbation caused by attaching the substrate may move some pairs closer to optimal alignment while it moves other pairs further away. On balance, as noted on FIG. 14, the mean efficiency is about the same, while the standard deviation is slightly increased. In other words, attaching the substrate does not appear to be a significant factor in degrading performance.

While the invention has been described in connection with specific embodiments, it will be understood that those with skill in the art may be able to develop variations of the disclosed embodiments without departing from the spirit of the invention or the scope of the following claims:

What is claimed is:

1. Apparatus for aligning a substantially co-linear array of lasers with a substantially co-linear array of optical fibers comprising;
   a. a single carrier having a slot for receiving both the array of lasers and the array of optical fibers;
   b. a first support plate having both a first holding means for holding said array of lasers in place with respect to said first support plate, and means for electrically coupling to selected ones of said lasers in said array of lasers;
   c. a second support plate having a second holding means for holding the array of fibers in rough alignment with the array of lasers; and
   d. means for positioning said carrier with respect to said first holding means and said second holding means so that when said holding means are activated, said array of lasers and said array of fibers are held in approximate alignment without said carrier.

2. The apparatus of claim 1 wherein said holding means each comprise means for supplying a vacuum, and an opening in a respective support plate through which vacuum is applied to a respective array.

3. The apparatus of claim 1 further comprising;
   a. adjustment means for moving said first support plate with respect to said second support plate; and b. an optical microscope for observing alignment of said array of lasers with respect to said array of fibers.

4. The apparatus of claim 1 further comprising positioning means for positioning in close proximity to said array of lasers and said array of fibers, a substrate to which said array of lasers and said array of fibers are to be fastened.

5. The apparatus of claim 4 wherein said positioning means includes a window positioned so that electromagnetic energy may be transmitted to said substrate.

6. The apparatus of claim 5 wherein said window and said substrate are transparent to ultraviolet light so that ultraviolet curing adhesive applied to said substrate to fasten said substrate to said array of lasers and said array of optical fibers may be cured by said ultraviolet light.

7. Apparatus for aligning a substantially co-linear array of lasers with a substantially co-linear array of optical fibers comprising;
   a. a carrier having a slot for receiving the array of lasers and the array of optical fibers;
   b. a first support plate having a first holding means for holding said array of lasers in place with respect to said first support plate, and means for electrically coupling to selected ones of said lasers in said array of lasers;
   c. a second support plate having a second holding means for holding the array of fibers in rough alignment with the array of lasers;
   d. means for moving said carrier between a first position wherein said array of lasers is spaced from said first holding means and said array of fibers is spaced from said second holding means to a second position in which said array of lasers is in contact with said first holding means and said array of fibers is in contact with said second holding means so that when said holding means are activated, said array of lasers and said array of fibers are held in approximate alignment when said carrier is moved away from said second position toward said first position.

8. The apparatus of claim 7 wherein said holding means each comprise means for supplying a vacuum, and an opening in a respective support plate through which vacuum is applied to a respective array.

9. The apparatus of claim 7 further comprising;
   a. adjustment means for moving said first support plate with respect to said second support plate; and
   b. an optical microscope for observing alignment of said array of lasers with respect to said array of fibers.

10. The apparatus of claim 7 further comprising positioning means for positioning in close proximity to said array of lasers and said array of fibers, a substrate to which said array of lasers and said array of fibers are to be fastened.

11. The apparatus of claim 10 wherein said positioning means includes a window positioned so that electromagnetic energy may be transmitted to said substrate.

12. The apparatus of claim 11 wherein said window and said substrate are transparent to ultraviolet light so that ultraviolet curing adhesive applied to said substrate to fasten said substrate to said array of lasers and said array of optical fibers may be cured by said ultraviolet light.

13. Apparatus for aligning a substantially co-linear array of lasers with a substantially co-linear array of optical fibers comprising;
   a. a carrier having a slot for receiving the array of lasers and the array of optical fibers;
   b. a first support plate having a first holding means for holding said array of lasers in place with respect to said first support plate, and means for electrically coupling to selected ones of said lasers in said array of lasers;
   c. a second support plate having a second holding means for holding the array of fibers in rough alignment with the array of lasers;
   d. means for positioning said carrier with respect to said first holding means and said second holding means so that when said holding means are activated, said array of lasers and said array of fibers are held in approximate alignment without said carrier; and
   e. positioning means for positioning in close proximity to said array of lasers and said array of fibers, a substrate to which said array of lasers and said array of fibers are to be fastened, said positioning means including a window positioned so that electromagnetic energy may be transmitted to said substrate, said window and said substrate being transparent to ultraviolet light so that ultraviolet curing adhesive applied to said substrate to fasten said substrate to said array of lasers and said array of optical fibers may be cured by said ultraviolet light.

14. The apparatus of claim 13 wherein said holding means each comprise means for supplying a vacuum, and an opening in a respective support plate through which vacuum is applied to a respective array.

15. The apparatus of claim 13 further comprising:
   a. adjustment means for moving said first support plate with respect to said second support plate; and
   b. an optical microscope for observing alignment of said array of lasers with respect to said array of fibers.

* * * * *